United States Patent
Khosrowbeygi et al.

(10) Patent No.: US 10,840,868 B1
(45) Date of Patent: Nov. 17, 2020

(54) LOGARITHMIC RMS-DETECTOR WITH SERVO LOOP

(71) Applicant: BeRex Inc., Los Altos, CA (US)

(72) Inventors: Abolfazl Khosrowbeygi, Cupertino, CA (US); Farbod Behbahani, Irvine, CA (US)

(73) Assignee: BeRex Corporation, Seoul (KR)

( * ) Notice: Subject to any disclaimer, the term of this patent is extended or adjusted under 35 U.S.C. 154(b) by 69 days.

(21) Appl. No.: 16/026,052

(22) Filed: Jul. 3, 2018

(51) Int. Cl.
| | | |
|---|---|---|
| *H03G 3/30* | (2006.01) | |
| *H03F 3/04* | (2006.01) | |
| *H03F 1/02* | (2006.01) | |
| *G01R 27/28* | (2006.01) | |
| *H03F 1/30* | (2006.01) | |

(52) U.S. Cl.
CPC ............... *H03G 3/30* (2013.01); *G01R 27/28* (2013.01); *H03F 1/0205* (2013.01); *H03F 1/30* (2013.01); *H03F 3/04* (2013.01); *H03F 2200/447* (2013.01); *H03G 2201/103* (2013.01); *H03G 2201/708* (2013.01)

(58) Field of Classification Search
CPC ............... H03G 3/30; H03G 2201/708; H03G 2201/103; H03F 1/30; H03F 1/0205; H03F 3/04; H03F 2200/447; G01R 27/28
USPC ................... 324/616, 615, 612, 600
See application file for complete search history.

(56) References Cited

U.S. PATENT DOCUMENTS

| | | | |
|---|---|---|---|
| 8,461,923 B2 | 6/2013 | Eken et al. | |
| 8,583,388 B2 * | 11/2013 | Yaguchi | G06F 30/367 702/60 |
| 9,531,389 B1 | 12/2016 | Behbahani | |
| 2003/0016028 A1 * | 1/2003 | Bass | F16L 53/37 324/642 |
| 2006/0097741 A1 * | 5/2006 | Payman | G01R 27/205 324/762.03 |
| 2008/0232436 A1 * | 9/2008 | Schwartz | H03F 1/0205 375/146 |
| 2012/0169424 A1 * | 7/2012 | Pinarello | H03F 1/3247 330/285 |
| 2017/0201275 A1 * | 7/2017 | Tabatabai | H03F 1/3247 |

* cited by examiner

*Primary Examiner* — Giovanni Astacio-Oquendo

(57) ABSTRACT

Systems and methods for measurement of signal power, when the signal is substantially variable or otherwise time varying. A log-linear VGA is coupled in a feedback configuration to a difference-of-squares detector and an integrator. The log-linear VGA includes a set of selectable amplifier cells. A sliding current generator selects one or more amplifier cells, wholly or partially, producing a sum of outputs. Some of the selectable amplifier cells have differential amplification, while others have similar amplification but are differentially attenuated. Switches turn off to isolate amplifier cells when the cell is not selected. Canceling circuits produce an output opposite to unselected amplifier cells, providing a sum near zero. Temperature compensation and other adjustment include two components: when the output y and the input x have the relation y=a+b log x the log-linear VGA can adjust either the offset or slope.

15 Claims, 12 Drawing Sheets

Signal Power Detector 100

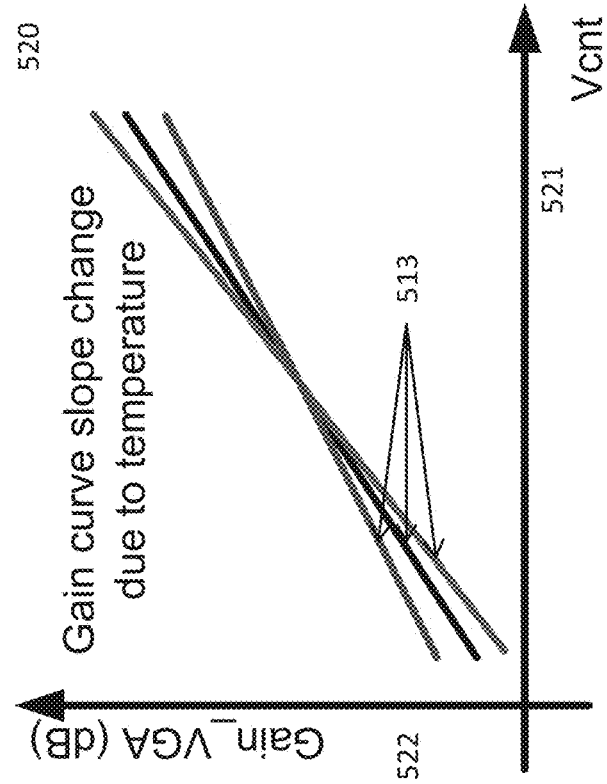
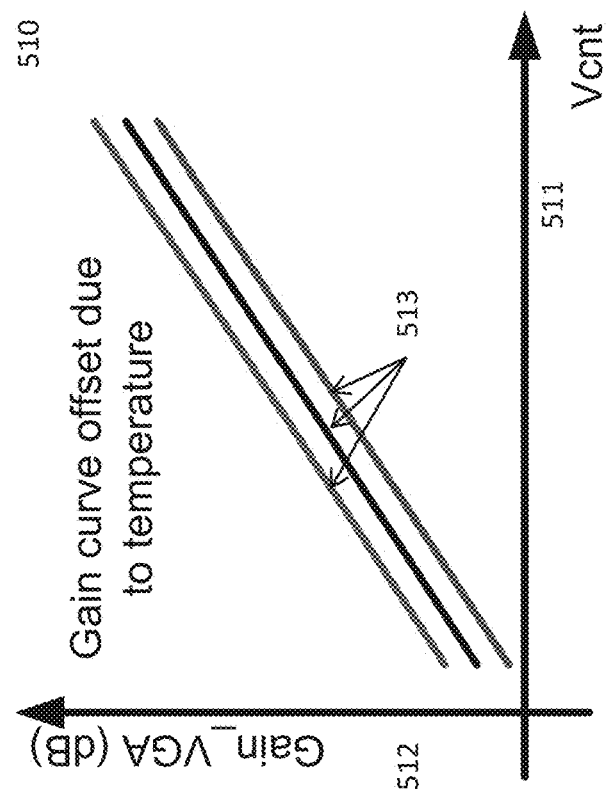
Figure 5

Figure 6
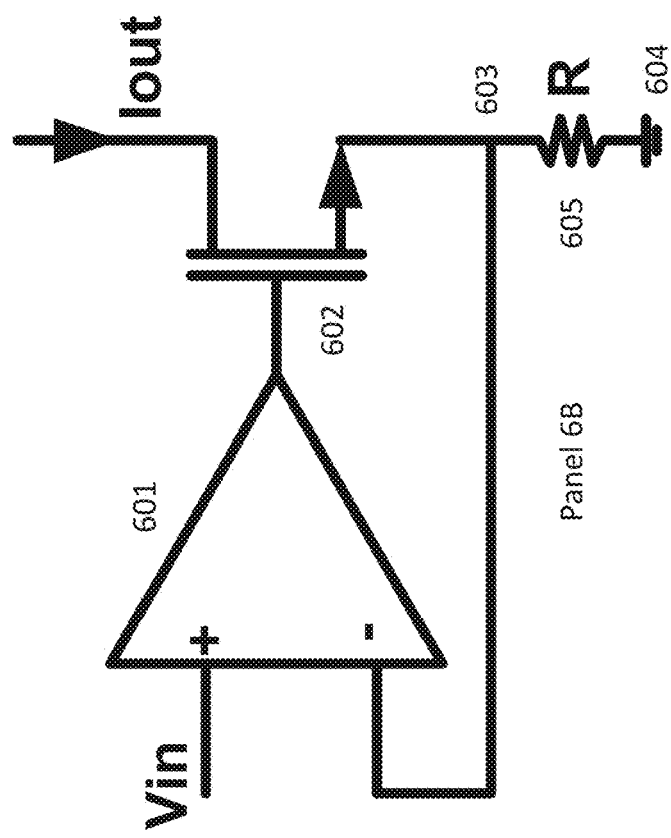
Panel 6B
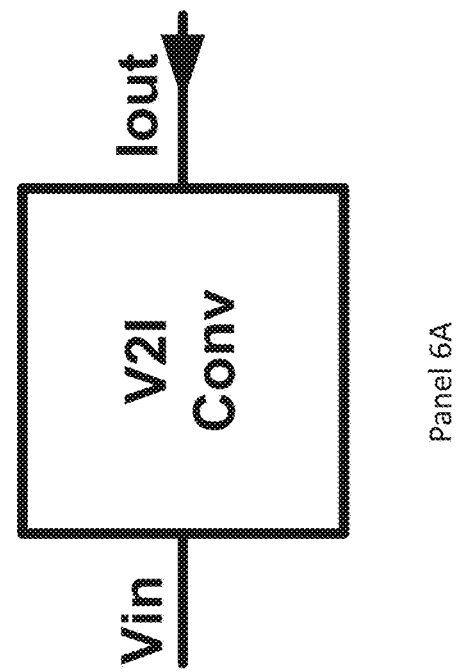
Panel 6A

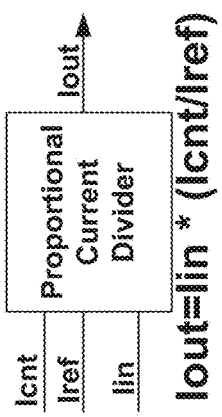
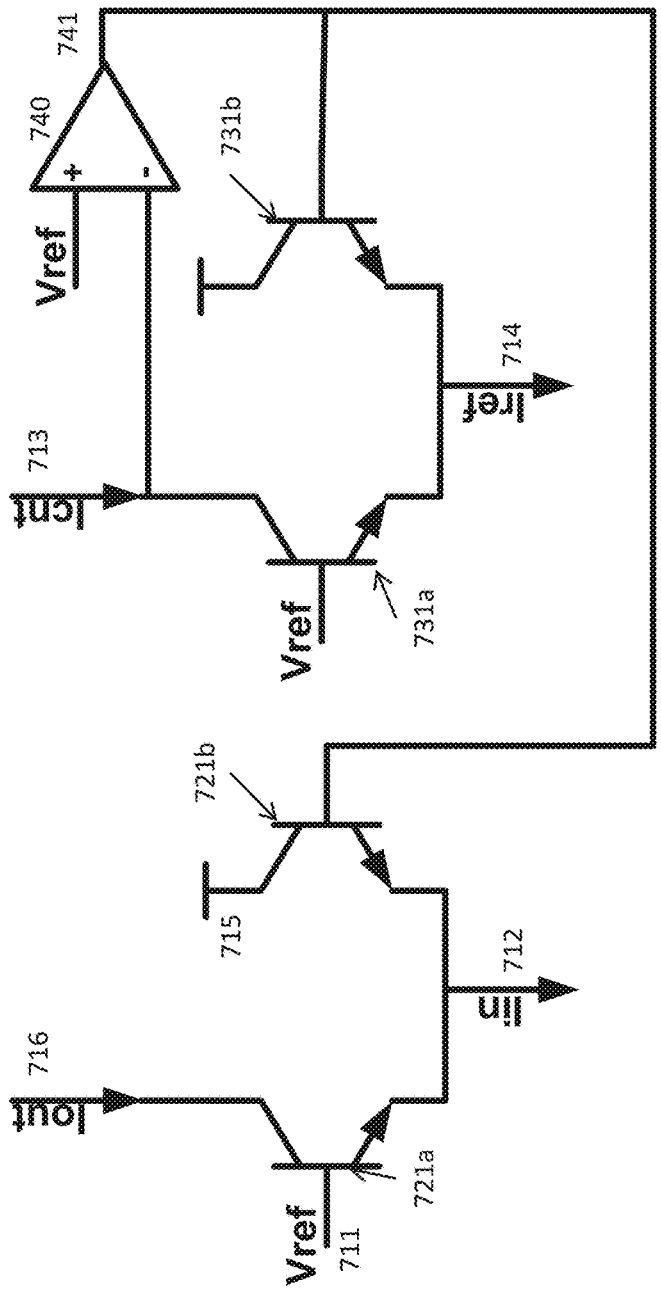
Figure 7
System 701

Current Generator 800

Current Limiter 900

Triangle Shape Generator 1000

Temperature Adjustment Circuit 1200

US 10,840,868 B1

LOGARITHMIC RMS-DETECTOR WITH SERVO LOOP

BACKGROUND

Field of the Disclosure

This Application generally describes techniques relating to measurement of signal power, related features and functions, and other topics.

Related Art

In methods and systems involving signal transmission or reception, it is often useful to measure signal power. For example, in wireless communication, input or output signal power can be related to a signal to noise ratio, or can otherwise be valuable to measure.

One problem with the known art is that measurement of signal power can be inaccurate when the signal is substantially variable. For example, signals that are modulated with message information, or which are modulated to fit within a selected frequency band, can be time varying and can present difficulties when accurately measuring their power level.

One known method for measuring signal power is shown in U.S. Pat. No. 8,461,923 B2 (Eken), which computes a sum of an amplified signal voltage by selecting one of a set of amplifiers. While this method can generally achieve its goal of power detection, it is subject to several drawbacks. These drawbacks can provide limits to its practical utility.

One problem is that selection of an individual amplifier can lead to artifacts in measurement at certain signal power values, such as near a transition between amplifiers. A sharp difference in amplifier gain can be problematic when the signal power is near such a transition. This can have the effect of providing inaccurate amplifier output and an inaccurate measure of signal power.

Another problem is that there can be current leakage between selectable amplifiers. For example, when the incoming signal is relatively large, one or more amplifiers can output a leaked signal that is larger than intended, possibly overwhelming the outputs of other amplifiers. This can have the effect of poor dynamic range of the total amplifier output; this also can produce an inaccurate measure of signal power.

Another problem is that temperature can distort operation of transistors, which can have the effect of producing inaccurate amplifier gain, particularly when temperature itself is variable over time. This, too, can have the effect of providing inaccurate amplifier output and an inaccurate measure of signal power.

Each of these issues, as well as other possible considerations, might cause difficulty in aspects of systems and methods involving measurement of signal power, particularly in those systems and methods in which the signal is rapidly varying or otherwise substantially variable.

SUMMARY OF THE DISCLOSURE

This Application describes systems and methods for measurement of signal power, such as when the signal is rapidly varying or otherwise substantially variable, such as when the signal is modulated with message information, or is modulated to fit within a selected frequency band, or is otherwise time varying. This Application also describes systems and methods for related features and functions, as well as other systems and methods.

In one embodiment, a signal power detector includes log-linear variable gain amplifier (VGA), coupled in a feedback configuration to a difference-of-squares detector and an integrator. The log-linear VGA includes a set of selectable amplifier cells. A sliding current generator selects one or more amplifier cells, in whole or in part, from which the log-linear VGA outputs a sum of outputs from the selected amplifier cells.

In one embodiment, a first group of the selectable amplifier cells have differential amplification, while a second group of which have similar amplification and are differentially attenuated. Unselected amplifier cells have isolation circuits, such as switches that are turned off when the amplifier cell is not selected. Unselected amplifier cells also have canceling circuits, such as cross-coupled transistors coupled to the amplifier cell, which produces an output opposite to the amplifier cell when it is not selected, thus a sum near zero. Unselected cells also have improved isolation.

In one embodiment, temperature compensation for the log-linear VGA includes two components. When the output y and the input x of the log-linear VGA have the log-linear relation $$y = a + b \log x,$$

temperature compensation for the log-linear VGA can adjust either a (an offset), b (a slope), or both.

BRIEF DESCRIPTION OF THE FIGURES

In the figures, like references generally indicate similar elements, although this is not strictly required. After reading this Application, those skilled in the art would recognize that the figures are not necessarily drawn to scale for construction, nor do they necessarily specify any particular location or order of construction.

FIG. 5 (collectively including two panels, 5A and 5B) shows a conceptual drawing of an example set of plots of gain alteration in response to temperature.

FIG. 6 (collectively including two panels, 6A and 6B) shows a conceptual drawing of an example voltage control to current control converter.

FIG. 7 (collectively including two panels, 7A and 7B) shows a conceptual drawing of an example reference current divider.

DETAILED DESCRIPTION

General Discussion

Figure 1:
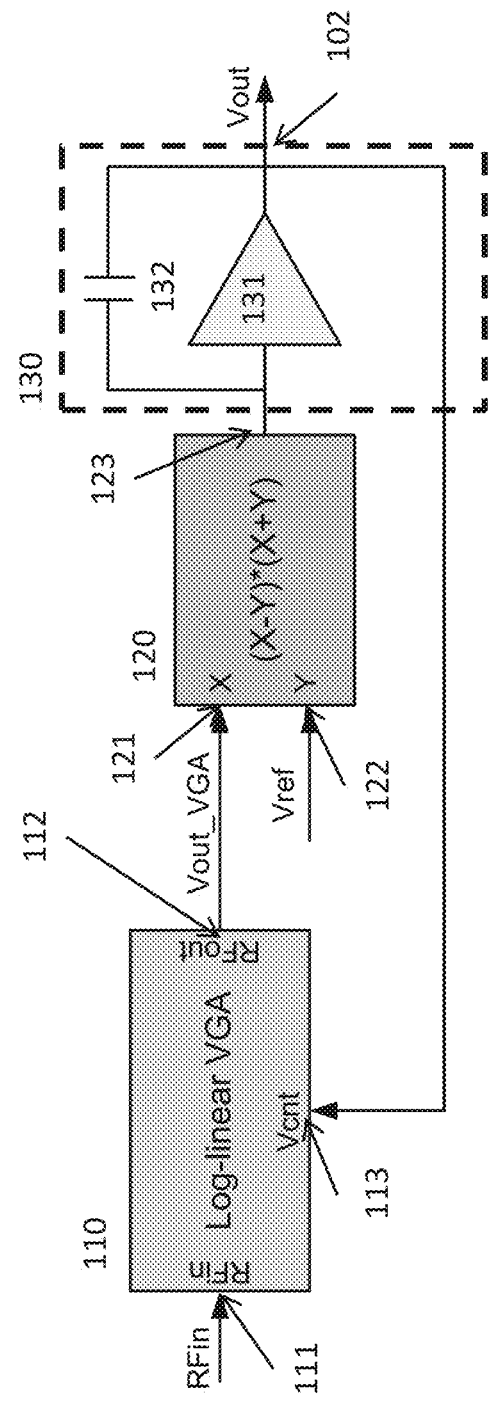
FIG. 1 shows a conceptual drawing of an example signal power detector.

In one embodiment, the log-linear variable gain amplifier (VGA) includes a set of amplifier cells. The amplifier cells include a first group of m amplifier cells whose gain differs from amplifier cell to amplifier cell, each amplifier cell in the first group having a gain of a dB (decibels) more than the next amplifier cell. The amplifier cells also include a second group of n amplifier cells whose gains are identical to each other, but whose inputs, derived from the input signal power, are attenuated by a dB more for each amplifier cell. This provides a sequence of m+n amplifier cells whose gain differs by a dB with respect to the system input signal, when compared between each adjacent pair of amplifier cells.

In one embodiment, the log-linear VGA includes a sliding current generator responsive to a control voltage Vcnt (which is also an output of the signal power detector). For example, the sliding current generator can provide one or more triangle-shaped control signals $I_1$ through $I_{m+n}$, one control signal $I_k$ for each amplifier cell. The control signals $I_k$ overlap with respect to Vcnt, with the effect that the log-linear VGA's gain transitions smoothly with changes in input signal power.

In one embodiment, each amplifier cell includes a bipolar junction differential amplifier, providing positive and negative current signals in response to an input power signal and in response to its control signal $I_k$. When the control signal $I_k$ is off, such as when it is zero current, one or more isolating switches are turned on to prevent leakage from other amplifier cells from reaching the amplifier cell's differential amplifier. Similarly, when the control signal $I_k$ is off, a shorting switch is turned on, which further attenuates the coupling between the differential amplifier and its input signals.

In one embodiment, each amplifier cell includes a canceling circuit coupled to the differential amplifier. For example, the canceling circuit can include cross-coupled transistors coupled to outputs of the differential amplifier. When the control signal $I_k$ is off, the cross-coupled transistors produce an output opposite to the differential amplifier. When this opposite output is summed with an output of the differential amplifier, the total output is near zero.

In one embodiment, the log-linear VGA includes a temperature compensation circuit disposed to alter the VGA's gain with respect to a control voltage Vcnt, in response to temperature variation. In one embodiment, a relationship between the VGA's gain (in dB) and Vcnt can be a straight line that does not vary with temperature. The temperature compensation circuit provides control voltages that separately control an offset and a slope of the VGA's gain in response to temperature. When the VGA's gain is so temperature compensated, it is (at least first order) independent of temperature.

Although this Application primarily describes one preferred set of techniques, in the context of the invention, there is no particular requirement for any such limitation. Other techniques would be workable, and could be incorporated into other system and methods, as well as those techniques described herein.

FIGURES AND TEXT

Signal Power Detector

FIG. 1 shows a conceptual drawing of an example signal power detector.

A signal power detector circuit 100 can include a log-linear variable gain amplifier (VGA) 110, a difference detector 120, and an integrator 130.

The VGA 110 has a VGA input node 111 coupleable to an input signal RFin, a VGA output node 112 coupled to the difference-of-squares detector 120, and a VGA control node 113 coupled to a control signal Vcnt.

The difference detector 120 is disposed with the VGA output node 112 coupled to its positive (X) input 121 and with a reference voltage Vref coupled to its negative (Y) input 122. The difference detector 120 determines a product in response to its X input 121 and Y input 122, (X−Y) (X+Y), which it provides at an output node 123. The difference detector 120 computes the difference (X−Y) and the sum (X+Y), and determines the product of those two values.

The output node 123 from the difference detector 120 is coupled to an input of the integrator 130. The integrator 130 includes an amplifier 131 and a capacitor 132 coupled in parallel. The integrator's (130) output (both Vcnt and Vout) is coupled to an output node 102 of the circuit 100, and is also coupled to the VGA control node 113.

Log-Linear VGA

Figure 2:
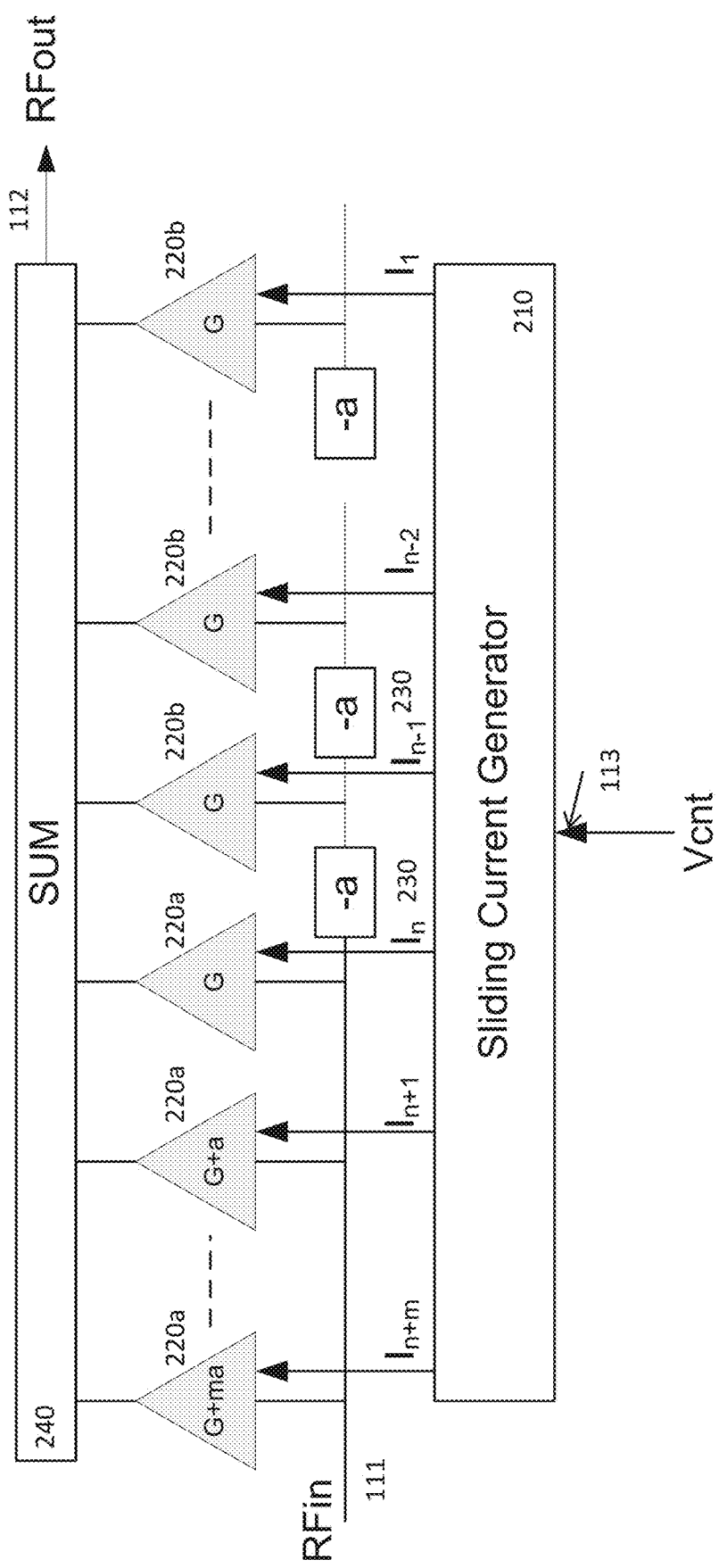
FIG. 2 shows a conceptual drawing of an example log-linear variable gain amplifier (VGA).

FIG. 2 shows a conceptual drawing of an example log-linear variable gain amplifier (VGA).

As further described herein, the log-linear VGA 110 includes the VGA input node 111 coupleable to the input signal RFin, the VGA output node 112, and the VGA control node 113 coupleable to a VGA control Vcnt. In one embodiment, the VGA 110 includes a sliding current generator 210, a first and second set of amplifier cells 220a and 220b, a set of signal attenuators 230, and a summing circuit 240. The first and second set of amplifier cells 220a (first set) and 220b (second set) are sometimes collectively referred to as amplifier cells 220.

In one embodiment, the VGA control node 113 is coupled to the sliding current generator 210. The sliding current generator 210 is disposed to provide one or more control signals $I_1$ through $I_{m+n}$, each one of the control signals $I_k$ coupled to an associated amplifier cell 220 (that is, an associated first amplifier cell 220a or an associated second amplifier cell 220b). For example, the control signals $I_k$ can be triangle-shaped (as further described with respect to FIG. 3) and can overlap with respect to the VGA control Vcnt, as further described herein.

In one embodiment, the control signals $I_{n+1}$ through $I_{m+n}$ are coupled to a first set of amplifier cells 220a, while the control signals $I_1$ through $I_n$ are coupled to a second set of amplifier cells 220b.

In one embodiment, the first set of amplifier cells 220a are each directly coupled to the VGA input node 111, thus directly coupled to the input signal RFin. The first set of amplifier cells 220a each have different amounts of gain, increasing by a dB with each such amplifier cell 220a as the control signal changes from $I_{n+1}$ to $I_{m+n}$. Thus, when the amplifier cell 220a coupled to control signal $I_n$ has gain G dB, the amplifier cell 220a coupled to control signal $I_{n+1}$ has gain G+a dB, and so on, and the amplifier cell 220a coupled to control signal $I_{m+n}$ has gain G+ma dB.

In one embodiment, the second set of amplifier cells 220b each have the same gain. In the example further described herein, that gain is G dB. The signal attenuators 230 are coupled in series to the VGA input node 111, thus coupled to, and responsive to, the input signal RFin. Each signal attenuator 230 imposes a further signal reduction on the input signal by −a dB. Thus, when the input signal RFin coupled to the amplifier cell 220 coupled to control signal $I_n$ is not attenuated (thus, with attenuated gain G dB), the amplifier cell 220b coupled to control signal $I_{n-1}$ is attenuated –a dB (thus, with attenuated gain G–a dB), and so on, and the amplifier cell 220b coupled to control signal $I_{n-k}$ is attenuated –ka dB (thus, with attenuated gain G–ka dB).

The first and second set of amplifier cells 220 (first set 220a and second set 220b), and the signal attenuators 230, collectively provide m+n amplifier cells whose gain differs by a dB per adjacent pair of amplifier cells.

The outputs of the first and second set of amplifier cells 220 (first set 220a and second set 220b) are coupled to corresponding inputs of the summation circuit 240. The summation circuit 240 provides the sum of its inputs at the VGA output node 112 as an output signal RFout.

Sliding Current Generator

Figure 3:
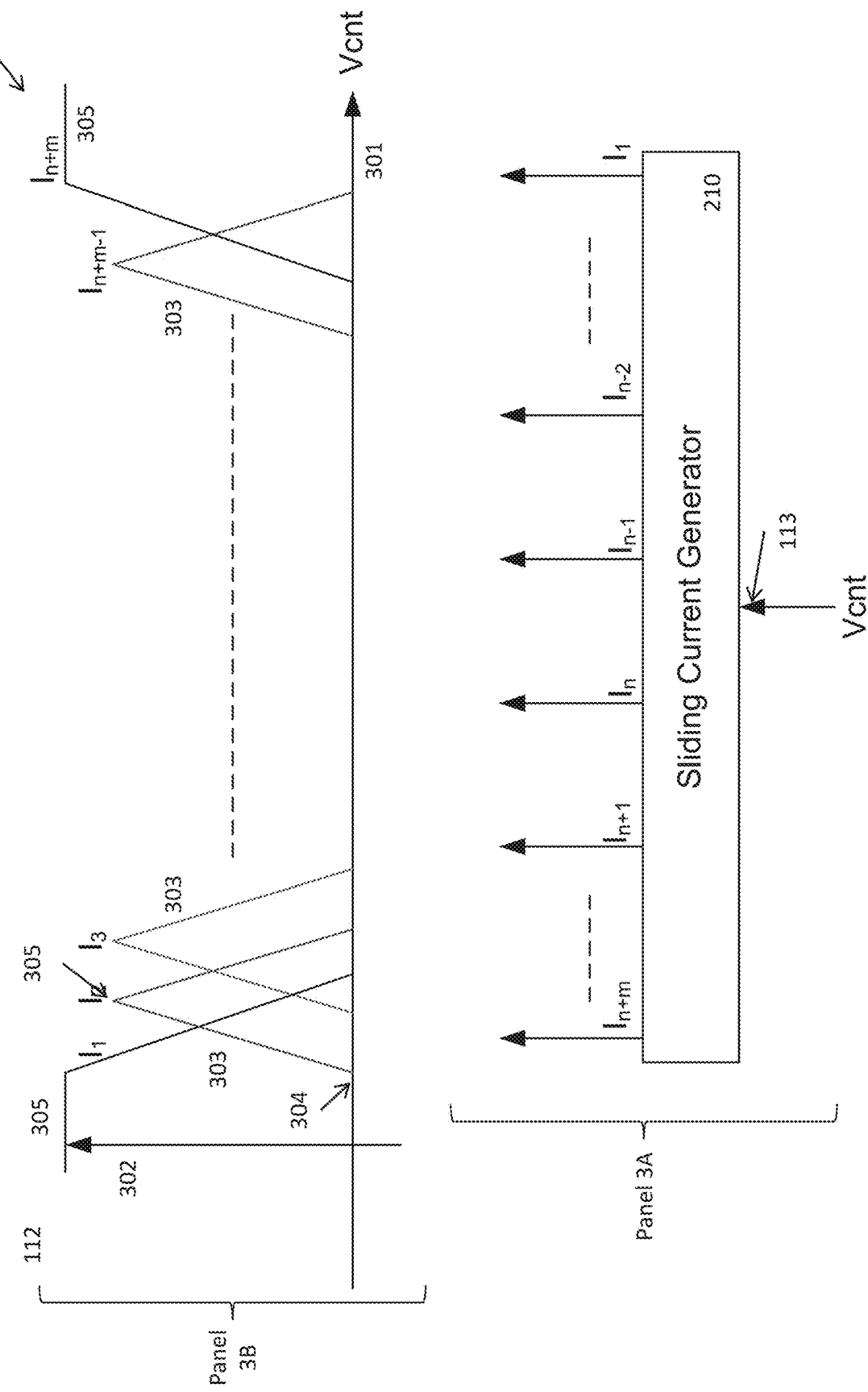
FIG. 3 (collectively including two panels, 3A and 3B) shows a conceptual drawing of an example set of output current plots associated with a sliding current generator.

FIG. 3 (collectively including two panels, 3A and 3B) shows a conceptual drawing of an example set of output current plots associated with a sliding current generator.

Panel 3A shows a conceptual drawing of an example sliding current generator.

As further described herein, the log-linear VGA 110 includes the sliding current generator 210, which is coupled to the VGA control Vcnt from the VGA control node 113, and which provides a set of control signals $I_1$ through $I_{m+n}$. The control signals $I_k$ include a first set of current outputs $I_1$ through $I_n$ and a second set of current outputs $I_{n+1}$ through $I_{m+n}$.

Panel 3B shows a conceptual drawing of an example set of output current plots.

The output current plots are shown with respect to a first axis 301 responsive to Vcnt, and a second axis 302 responsive to an amount of current $I_k$. In one embodiment, each amount of current $I_k$ can have a triangular shape 303, rising linearly from zero current 304 to a maximum current 305 (or nearly so), and then falling linearly from the maximum current 305 back to zero current 304, in response to Vcnt. While this Application primarily describes current $I_k$ which can have a triangular shape, in the context of the invention, there is no particular requirement for any such limitation. For example, the current $I_k$ can have any selected shape, however arbitrary, that starts and ends at zero current. A first current $I_1$ starts at the maximum current 305 and falls to zero current 304, in response to Vcnt. A last current $I_{m+n}$ starts at zero current 304 and rises to the maximum current 305, in response to Vcnt.

VGA Cell

Figure 4:
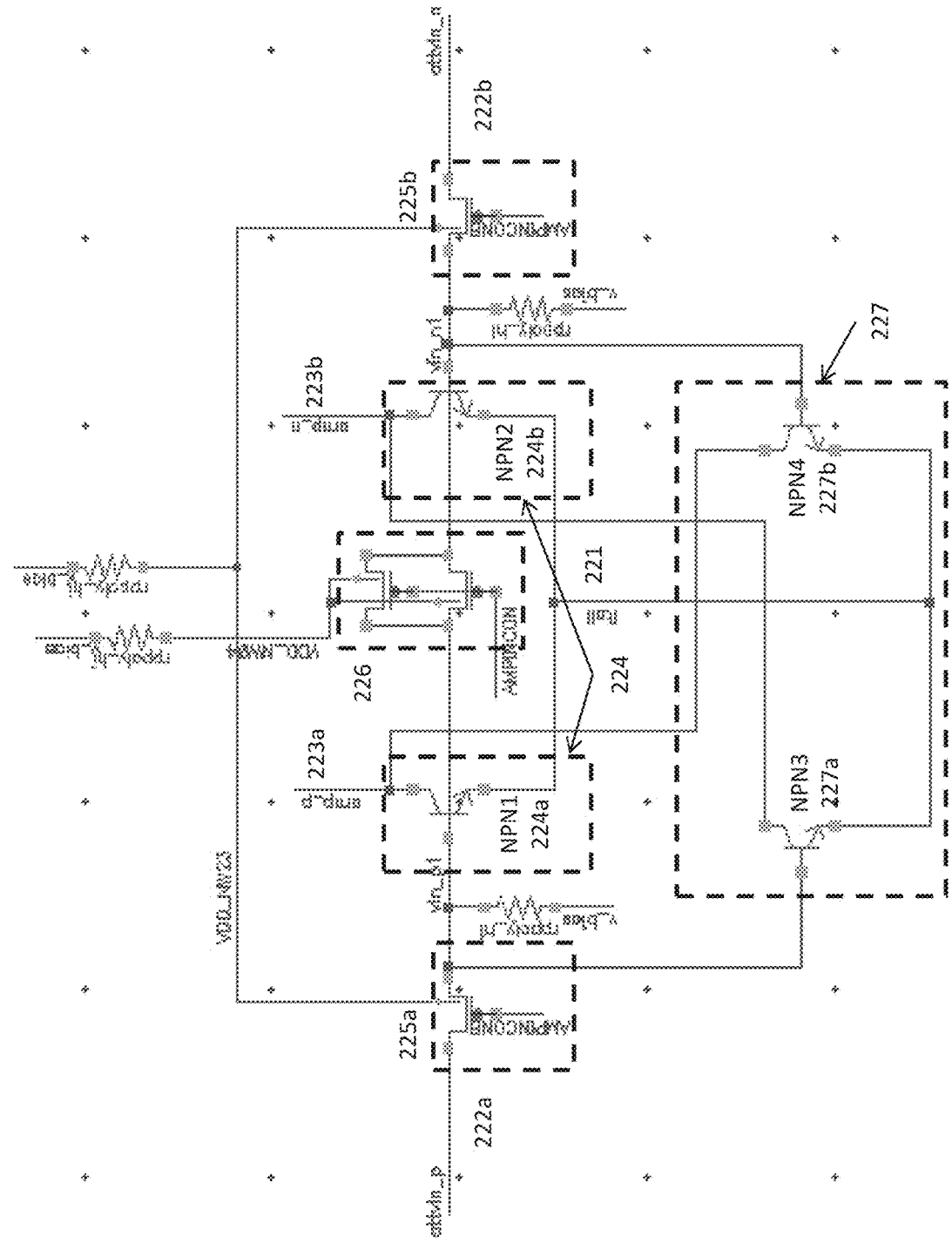
FIG. 4 shows a conceptual drawing of an example VGA amplifier cell.

FIG. 4 shows a conceptual drawing of an example VGA amplifier cell.

In one embodiment, each amplifier cell 220 (220a or 220b) includes a signal control node 221a in the center of the figure in the center of the figure, labeled "Itail", a signal control node 221b at the isolating switches and shorting switch, labeled "AMPONCONB" (coupled to a control signal $S_k$), a pair of (positive and negative) input signal input nodes 222a and 222b at the extreme right and left of the figure, labeled "attnvin_p" and "attnvin_n", and a pair of (positive and negative) output nodes 223a and 223b coupled to transistors NPN1 and NPN2, labeled "amp_p" and "amp_n". The signal control node 221a is coupled to the control signal $I_k$. The signal control node 221b is coupled to the control signal $S_k$, which is ON if $I_k$ has more than zero current, and OFF otherwise; the inverse $\sim S_k$ is a digital logical inverse thereof. The input signal input nodes 222a and 222b are coupled to the (possibly attenuated) input signal RFin. The output nodes 223a and 223b are coupled to the summing circuit 240.

In one embodiment, each amplifier cell 220 (220a or 220b) also includes an amplifier element 224, one or more isolation switches 225a and 225b, a shorting switch 226, and a canceling circuit 227.

As further described herein, the amplifier element 224 amplifies the (possibly attenuated) input signal RFin by the amplifier cell's (220a or 220b) gain (such as G dB). The amplifier element 224 includes two NPN transistors 224a and 224b. The NPN transistors 224a and 224b have their emitters coupled to the signal control node 221, and their collectors coupled to the output nodes 223a and 223b respectively. The transistors 224a and 224b have their bases coupled to the input signal input nodes 222a and 222b respectively. The control signal $I_k$ is modified by a bias voltage Vbias the bases of 224a and 224b using bias resistors 228a and 228b respectively.

As further described herein, the isolation switches 225a and 225b decouple the leakage current between amplifier cells 220 (220a or 220b) when the control signal $I_k$ turns off the amplifier cell 220 (220a or 220b), thus, when $I_k$ is zero current.

In one embodiment, the isolation switches 225a and 225b are disposed between the amplifier element 224 and the (positive and negative) input signal input nodes 222a and 222b, as shown in the figure. Thus, one isolation switch 225a is coupled between the positive input signal input node 222a and the amplifier element 224, and another isolation switch 225b is coupled between the negative input signal input node 222b and the amplifier element 224.

Each isolation switch 225a and 225b includes a transistor disposed with its gate controlled by the control signal $S_k$, as shown in the figure. When the control signal $S_k$ turns off the amplifier cell 220 (220a or 220b), the transistor for each isolation switch 225a and 225b is also turned off, disconnecting the inputs of the NPN transistors 224a and 224b from the input signal RFin, as shown in the figure. This has the effect of reducing the leakage current from the input to the output of the amplifier cell 220 (220a or 220b) when the amplifier cell 220 (220a or 220b) should be off.

As further described herein, the shorting switch 226 further attenuates any leakage passing through isolation switches 225a and 225b that have been turned off.

In one embodiment, the shorting switch 226 includes two transistors with their gates controlled by the (inverted) control signal $\sim S_k$, as shown in the figure. When the control signal $S_k$ turns off the amplifier cell 220 (220a or 220b), the transistors for the shorting switch's (226) transistors are also turned on. The shorting switch 226 is coupled to the gates of the amplifier element's (224) transistors 224a and 224b, as shown in the figure.

As further described herein, the control signal $S_k$ causes the canceling circuit 227 to negate the leakage current from the amplifier cell 220 (220a or 220b) when the control signal $S_k$ turns off the amplifier cell 220 (220a or 220b), having the effect of further cancelling any leakage from the input to the output of the amplifier cell 220 (220a or 220b) when the amplifier cell 220 (220a or 220b) should be off.

In one embodiment, the canceling circuit 227 includes transistors 227a and 227b, with coupled emitters, and cross-coupled from the amplifier element's (224) transistors 224a and 224b, as shown in the figure. The positive amplifier transistor's (224a) collector is coupled to the negative canceling transistor's (227a) collector, and the negative amplifier transistor's (224b) collector is coupled to the positive canceling transistor's (227b) collector. In contrast, the positive amplifier transistor's (224a) gate is coupled to the positive canceling transistor's (227b) gate, and the negative amplifier transistor's (224a) gate is coupled to the negative canceling transistor's (227b) gate. This has the effect that, when the control signal $S_k$ turns off the amplifier cell 220 (220a or 220b), any residual output signal the amplifier element 224 generates is negated by the canceling circuit 227.

Gain Alteration in Response to Temperature

FIG. 5 (collectively including two panels, 5A and 5B) shows a conceptual drawing of an example set of plots of gain alteration in response to temperature.

Offset Alteration

Panel 5A shows a conceptual drawing of a first example set of plots of gain alteration in response to temperature.

A set of plots 510 includes a first axis 511 responsive to the VGA control Vcnt, a second axis 512 responsive to the VGA gain (in dB), and a set of gain curves 513 showing VGA gain as a function of Vcnt.

When temperature changes, the gain curve 513 changes, due to temperature effects on transistor operation. In these plots 510, the gain curve 513 changes its offset. Thus, when the output y and the input x of the log-linear VGA have the log-linear relation $$y=a+b \log x,$$

the offset (a) changes with temperature.

Slope Alteration

Panel 5B shows a conceptual drawing of a second example set of plots of gain alteration in response to temperature.

A set of plots 520 includes a first axis 521 responsive to Vcnt, a second axis 522 responsive to the VGA gain (in dB), and a set of gain curves 523 showing VGA gain as a function of Vcnt.

When temperature changes, the gain curve 523 changes, due to temperature effects on transistor operation. In these plots 520, the gain curve 523 changes its slope. Thus, when the output y and the input x of the log-linear VGA have the log-linear relation $$y=a+b \log x,$$

the slope (b) changes with temperature.

Control Current Generator

FIG. 6 (collectively including two panels, 6A and 6B) shows a conceptual drawing of an example voltage control to current converter.

First Current Divider

Panel 6A shows a first conceptual drawing of an example voltage to current converter. In this conceptual drawing, an input voltage Vin is converted to an output current Iout by a voltage/current (V2I) converter.

Second Current Divider

FIG. 6B shows a conceptual drawing of a second example linear voltage to current converter.

It is desired to determine a reference current Iref, so that control current values Icnt can be measured with respect to Iref. But if Vin is responsive to Iout without using the relationship Iout=Vin/R, where R is some resistance, the ratio Icnt/Iref will not change when R itself varies with temperature. Accordingly, Iout is determined with respect to a Vin that is selected without reference to temperature; thus, fur suitable Vin, Iout can be used as a reference current Iref.

In this conceptual drawing, an input voltage Vin is coupled to an amplifier's (601) positive input. The amplifier's (601) output is coupled to a transistor's (602) gate. The output current Iout is coupled to the transistor's (602) collector. The transistor's (602) source is coupled to a feedback node 603, which is coupled to the amplifier's (601) negative input. The feedback node 603 is coupled to ground 604 using a resistor 605.

Reference Current Divider

FIG. 7 (collectively including two panels, 7A and 7B) shows a conceptual drawing of an example reference current divider.

Panel 7A shows a first conceptual drawing of an example proportional current divider.

In this conceptual drawing, a proportional current divider 701 determines an output current Iout with respect to an input current Iin, a control current Icnt, and a reference current Iref. The output current Iout is determined according to the relation $$Iout=Iin \cdot (Icnt/Iref).$$

Panel 7B shows a second conceptual drawing of an example reference current divider.

In one embodiment, the proportional current divider 701 includes an input node 711 coupled to Vref, another input node 712 coupled to Iin, another input node 713 coupled to Icnt, another input node 714 coupled to Iref, another input node 715 coupled to Vdd (that is, a "high" voltage), and an output node 716 coupled to Iout.

In such cases, the proportional current divider 701 includes a first pair of emitter-coupled transistors 721a and 721b, a second pair of emitter-coupled transistors 731a and 731b, and an amplifier 740.

In such cases, in the first pair of emitter-coupled transistors, the transistor 721a has its gate coupled to Vref, has its collector coupled to Iout, and has its emitter coupled to Iin. The transistor 721b has its collector coupled to Vdd, such as using a resistor (not shown), and also has its emitter coupled to Iin, as shown in the figure.

In such cases, in the second pair of emitter-coupled transistors, the transistor 731a also has its gate coupled to Vref, has its collector coupled to Icnt, and has its emitter coupled to Iref. The transistor 731b also has its collector coupled to Vdd, such as using a resistor (not shown), and also has its emitter coupled to Iref, as shown in the figure.

In such cases, the amplifier 740 has its positive input coupled to Vref and its negative input coupled to Icnt, such as using a resistor (not shown). The amplifier's (740) output, at a node 741, is coupled to the gates of transistors 721b and 731b, as shown in the figure.

Current Limiter

Figure 8:
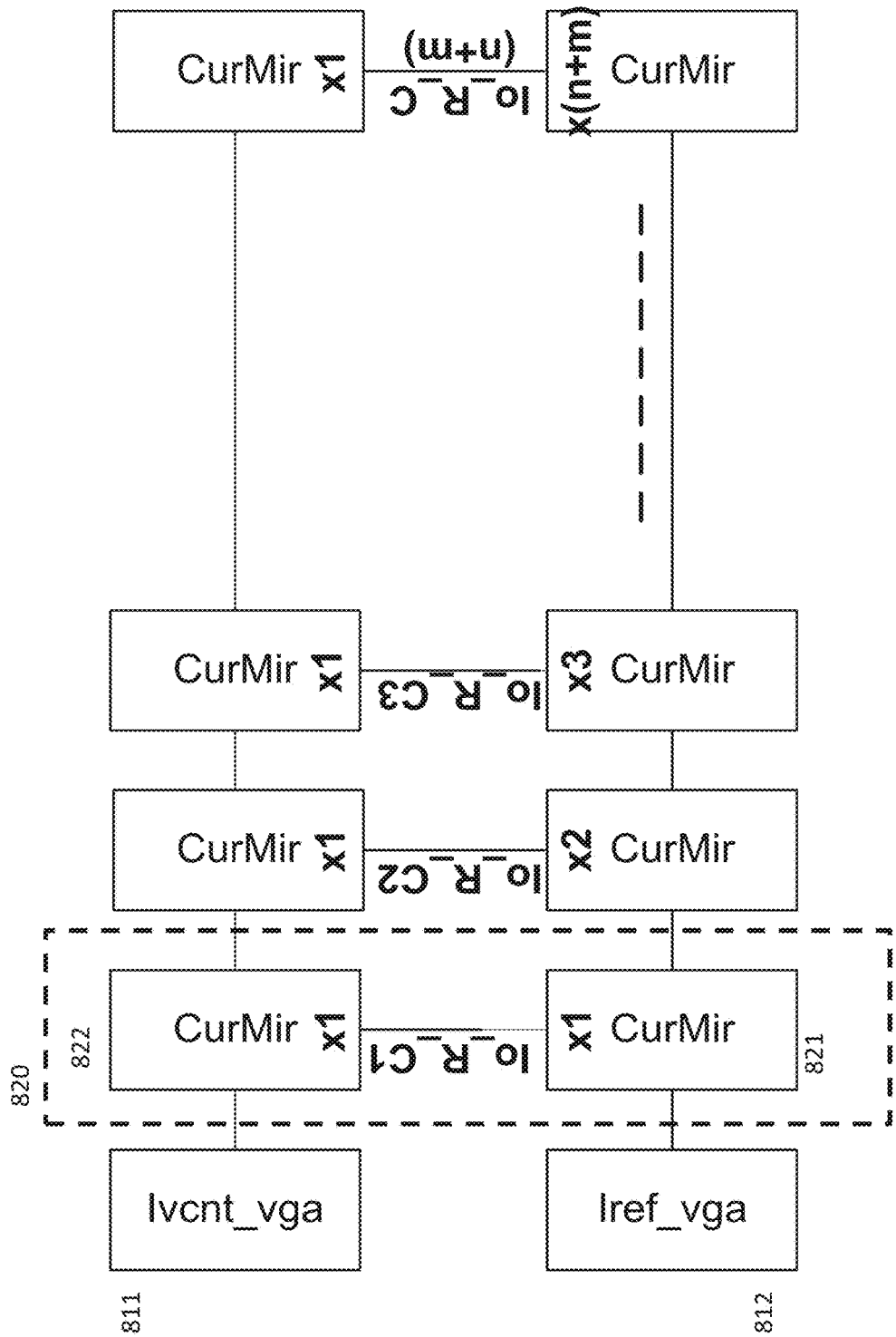
FIG. 8 shows a conceptual drawing of an example ramp-shift current generator.

FIG. 8 shows a conceptual drawing of an example ramp-shift current generator.

A ramp-shift current generator 800 is disposed to generate a set of ramp currents, each shifted in response to the VGA control Vcnt. This has the effect that increases in Vcnt produce increases in each of the ramp currents, when those ramp currents are currently ramping up. Ramp currents that are shifted sufficiently that they are not yet ramping up do not increase when Vcnt increases; instead, they get closer to the value of Vcnt when they will start ramp up.

In one embodiment, the ramp-shift current generator 800 includes a first input 811 coupled to an Ivcnt current, and a second input 812 coupled to an Iref current. The Ivcnt current is derived from the Vcnt voltage. The Iref current is a reference current, which can be derived from a reference Vref voltage, or which can be independently generated.

In one embodiment, the ramp-shift current generator 800 includes a sequence of m+n generator stages 820. Each stage 820 includes a reference current mirror 821 and a control current mirror 822. The first current mirror 821 is coupled to the first input 811; the second current mirror 822 is coupled to the second input 812. Each stage 820 is coupled to the just-previous stage 820.

In one embodiment, each reference current mirror 821 has a multiple of one, and generates the same current as its input. The first control current mirror 822 has a multiple of one, and each succeeding control current mirror 822 has a multiple of one greater than the just-previous stage 820, thus, times two, times three, and so on to times m+n, the number of stages 820.

Each reference current mirror 821 draws Iref from its associated control current mirror 822. This has the effect that the $k^{th}$ control current mirror 822 generates k times the Iref current, minus the Icnt current. Thus, the current generated by each succeeding control current mirror 822 has the relationship output current=$(k \cdot Iref) - Icnt$, with a minimum output current of zero.

In one embodiment, the output from each control current mirror 822 is coupled to a current limiter, as further described herein.

Figure 9:
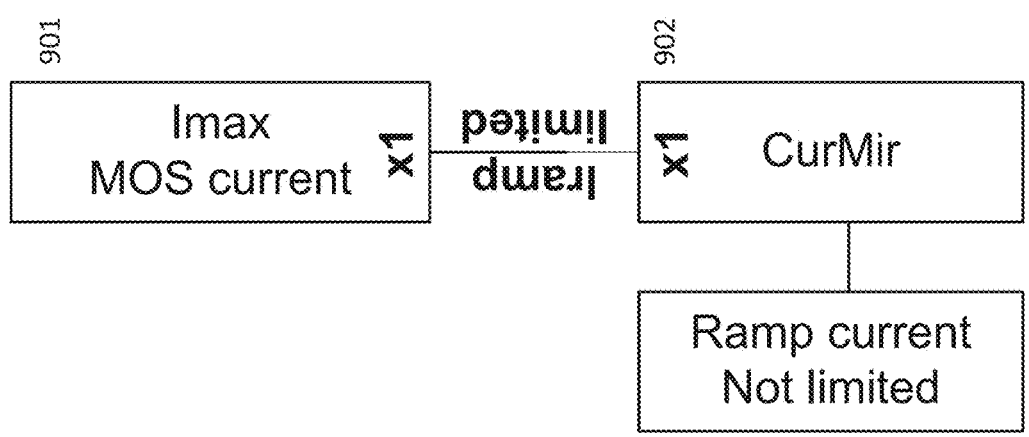
FIG. 9 shows a conceptual drawing of an example current limiter.

FIG. 9 shows a conceptual drawing of an example current limiter.

A current limiter 900 is disposed to receive one of the ramp currents, and to generate a current-limited ramp current. There can be one or more current limiters 900 for each ramp current. This has the effect that the current-limited ramp currents have both a minimum current (zero) and a maximum current (Imax).

In one embodiment, the current limiter 900 includes an Imax current mirror 901 and a ramp current mirror 902. Each of the current mirrors 901 and 902 has a multiple of one, and generates the same current as its input. This has the effect that the ramp current mirror 902 generates the unlimited ramp current, but no more than the Imax current. Thus, the ramp current mirror's (902) is limited to Imax.

In one embodiment, the output from the current limiter 900 is coupled to a triangle shape generator, as further described herein.

Figure 10:
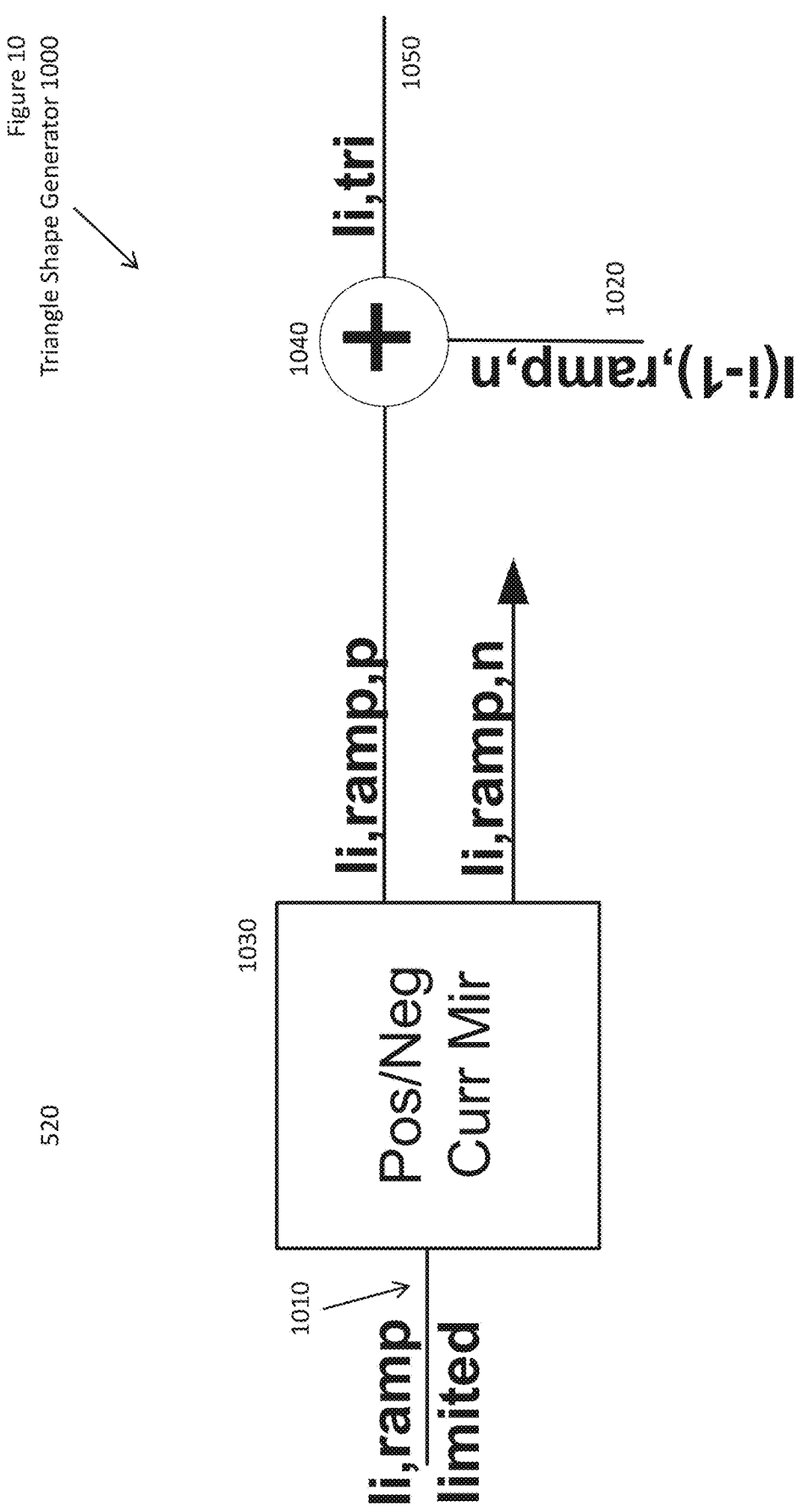
FIG. 10 shows a conceptual drawing of an example triangle shape generator.

FIG. 10 shows a conceptual drawing of an example triangle shape generator.

A triangle shape generator 1000 is disposed to generate a triangle shape current Itri for each amplifier cell 220 (220a or 220b), as further described herein. The $k^{th}$ such Itri is described with respect to FIGS. 2-3 as $I_k$. As the VGA control Vcnt varies, one or more $I_k$ is generated, and the sum output by the VGA 200. The sum of multiple $I_k$, such as when those currents overlap, can provide a relatively smooth transition with respect to Vcnt.

In one embodiment, the triangle shape generator 1000 includes a first input 1010 coupled to the $k^{th}$ current limiter's (900) output Iramp[k], a second input 1020 coupled to the $(k-1)^{st}$ current limiter's (900) negative output Iramp$^-$[k−1] (as further described herein), a positive/negative current mirror 1030, a summing circuit 1040, and an output 1050.

In one embodiment, the first input 1010 couples Iramp[k] to the positive/negative current mirror 1030, which generates a positive version Iramp$^+$[k] and a negative version Iramp$^-$[k]. The positive version Iramp$^+$[k] is coupled to the summing circuit 1040, as is the $(k-1)^{st}$ current limiter's (900) negative version Iramp$^-$[k−1]. An output of the summing circuit 1040 generates an output current $I_k$, which is triangle shaped with respect to change in Vcnt.

Figure 11:
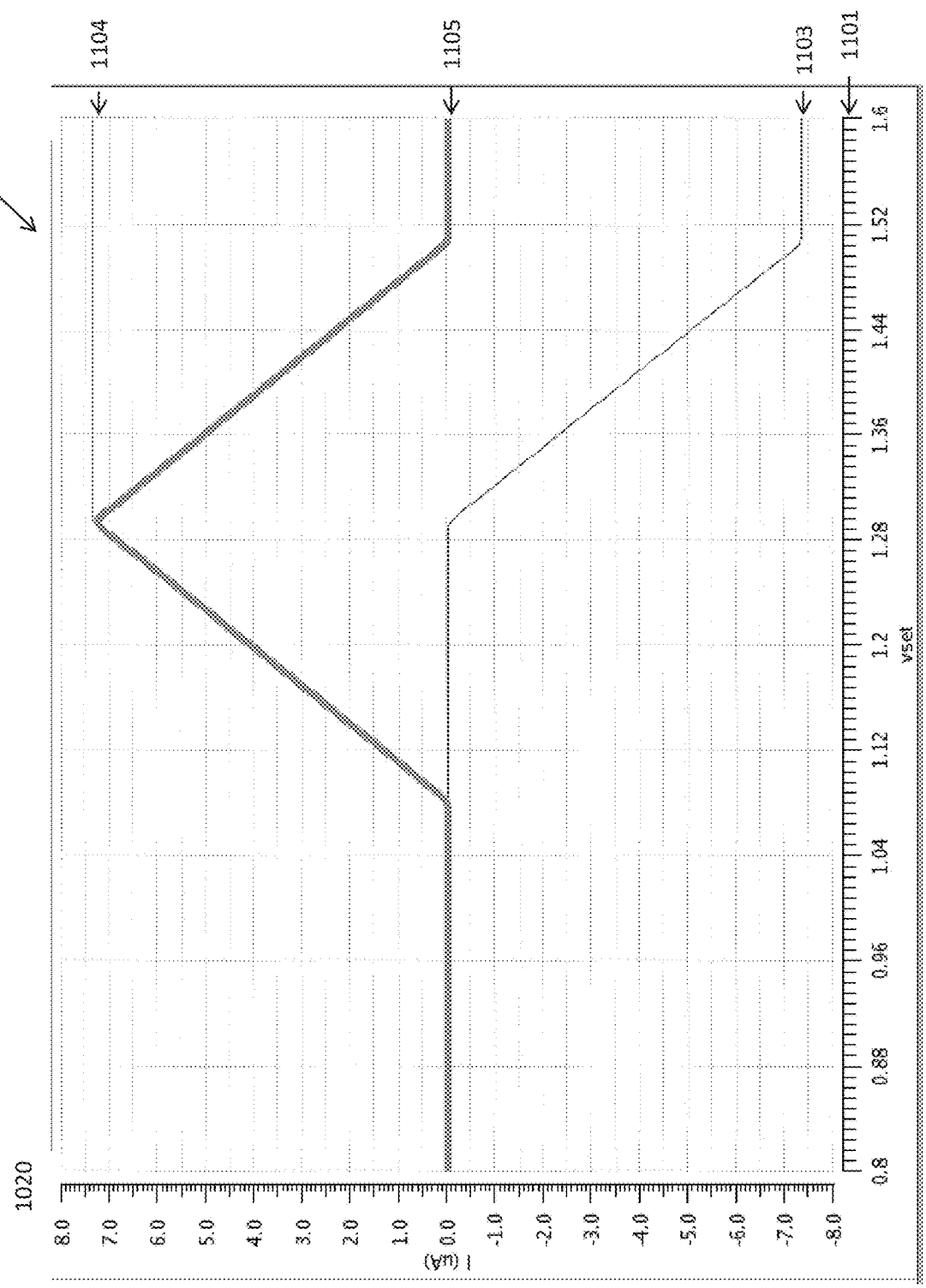
FIG. 11 shows a conceptual drawing of an example set of plots showing triangle shape generation.

FIG. 11 shows a conceptual drawing of an example set of plots showing triangle shape generation.

A set of plots 1100 includes a first axis 1101 responsive to the VGA control Vcnt, a second axis 1102 responsive to one or more currents (in µA), and a set of plots showing output currents Iramp$^-$[k−1] 1103, Iramp$^+$[k] 1104, and Iramp$^-$[k−1]+Iramp$^+$[k] 1105 (thus $I_k$), as a function of Vcnt.

The output current Iramp$^-$[k−1] 1103 ramps from zero to −Imax with respect to Vcnt, as shown in the figure. The output current Iramp$^+$[k] 1104 ramps from zero up to +Imax with respect to Vcnt, at a lag to Iramp$^-$[k−1] with respect to Vcnt, as shown in the figure. The total of Iramp$^-$[k−1] and Iramp$^+$[k] (thus $I_k$) has a rising and falling triangle shape, as shown in the figure.

When multiple triangle currents $I_k$ are combined, the total output current, such as from the summing circuit 240, provides a smooth transition with respect to changes in Vcnt.

Temperature Adjustment Circuit

Figure 12:
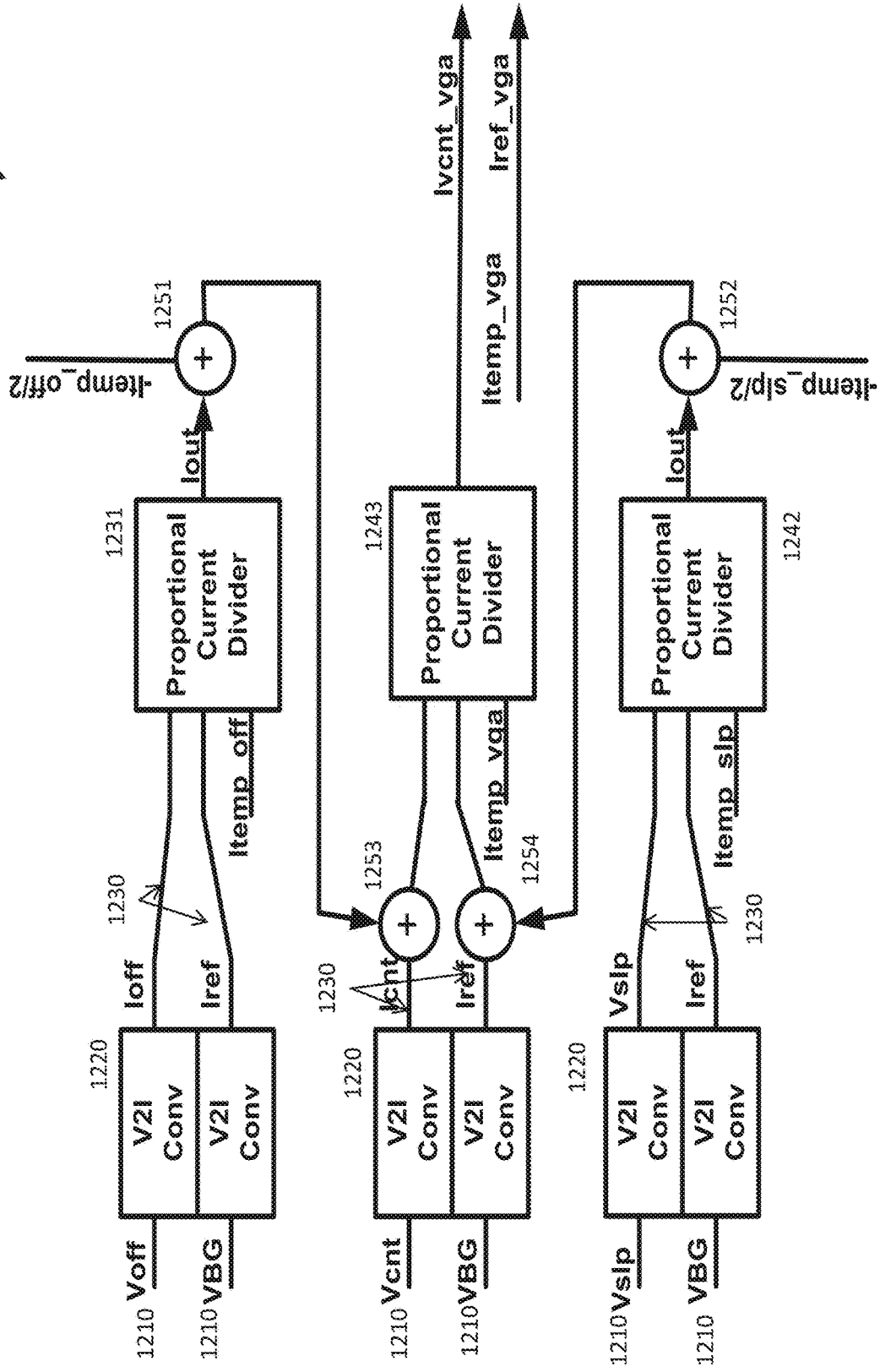
FIG. 12 shows a conceptual drawing of an example temperature adjustment circuit.

FIG. 12 shows a conceptual drawing of an example temperature adjustment circuit.

A temperature adjustment circuit 1200 includes a set of voltage inputs 1210, including at least: Voff, a control for offset of VGA gain in response to temperature, Vslp, a control for slope of VGA gain in response to temperature, Vcnt, a control for intended VGA gain, and Vbg, a bandgap reference voltage independent of temperature. The temperature adjustment circuit 1200 also includes a set of voltage to current (V2I) converters 1220 coupled to the input voltages, each of which provides a corresponding current: Ioff in response to Voff, Islp in response to Vslp, Icnt in response to Vcnt, and Iref, a reference current, in response to Vbg.

The temperature adjustment circuit 1200 also includes a set of current inputs 1230, including at least: Itemp_off, a reference to temperature compensated offset of VGA gain, Itemp_slp, a reference to temperature compensated slope of VGA gain, and Itemp_vga. In one embodiment, these three currents have proper temperature dependency (such as proportional to absolute temperature). For example, this can have the effect of minimizing VGA gain curve variation with respect to temperature.

The currents Ioff, Iref, and Itemp_off, are coupled to a first proportional current divider (PCD) 1241, which provides an output current Iout. This output current Iout, and a current representing half of Itemp_off, are coupled to a first summing circuit 1251.

The currents Islp, Iref, and Itemp_slp, are coupled to a second PCD 1242, which provides another output current Iout. This output current Iout, and a current representing half of Itemp_slp, are coupled to a second summing circuit 1252.

The current Icnt, and an output from the first summing circuit 1251, are coupled to a third summing circuit 1253. The current Iref, and an output from the second summing circuit 1252, are coupled to a fourth summing circuit 1254.

The current Itemp_vga, an output from the third summing circuit 1253, and an output from the fourth summing circuit 1254, are coupled to a third PCD 1243, which provides an output current Ivcnt_vga.

The current Ivcnt_vga and Iref_vga are applied at 811 and 812 respectively to the ramp-shift current generator 800, as shown with respect to FIG. 8.

Alternative Embodiments

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

While this Application primarily describes techniques related to signal power measurement, in the context of the invention, there is no particular reason for any such limitation. Techniques described herein have broad applicability to other signal processing applications. Moreover, while specific advantages have been enumerated above, various embodiments may include these or other advantages.

After reading this Application, those skilled in the art would recognize other and further uses for the techniques described herein, including other and further techniques (including systems and methods) for signal power measurement and signal processing. The claims are hereby incorporated into this specification as if fully set forth herein. None of the appended claims or claim elements are intended to invoke 35 USC 112(f) unless the words "means for" or "step for" are explicitly recited in the claim.

The invention claimed is:

1. A signal power detector, including
a log-linear variable gain amplifier responsive to a control node, the variable gain amplifier including: (A) a sliding current generator providing a set of current signals in response to the control node, (B) a first set of amplifiers each coupled to an independent output of the sliding current generator, wherein each one amplifier in the first set has decreased gain from a previous amplifier, (C) a second set of amplifiers each coupled to an independent output of the sliding current generator, wherein each one amplifier in the second set has the same gain as a previous amplifier, and has an attenuator coupled between input signal and the each one amplifier in the second set, and (D) a summing circuit coupled to outputs of both the first and second sets of amplifiers;
a detector coupled to an output of the log-linear variable gain amplifier, an output of the detector coupled to the control node of the log-linear variable gain amplifier, the detector computing a product of a difference and a sum of inputs of the detector;
wherein an output of the detector is responsive to a steady-state level of an input signal to the log-linear variable gain amplifier.

2. The signal power detector as in claim 1, including
a temperature adjustment circuit, the temperature adjustment circuit responsive to changes in gain responsive to temperature, the changes in gain responsive to temperature including: a change in offset to gain in response to temperature, a change in slope of gain in response to temperature.

3. The signal power detector as in claim 1, wherein
each one amplifier in either the first set of amplifiers or the second set of amplifiers includes at least one canceling stage, the canceling stage cross-coupled with the amplifier, the canceling stage operating to reduce leakage between amplifiers.

4. The signal power detector as in claim 1, wherein
each one amplifier in either the first set of amplifiers or the second set of amplifiers includes one or more isolating switches, the isolating switches controlled by a switch control, the switch control correlated with the output of the sliding current generator, the isolating switches operating to reduce leakage between amplifiers.

5. The signal power detector as in claim 1, wherein
each one amplifier in the first set of amplifiers includes one or more isolating switches, the isolating switches controlled by a switch control, the switch control correlated with the output of the sliding current generator, the isolating switches operating to reduce leakage between amplifiers.

6. The signal power detector as in claim 1, wherein
the current signals provided by the sliding current generator include two zero current points and a peak current between the two zero current points.

7. The signal power detector as in claim 1, wherein
the decreased gain between each adjacent pair of the first set of amplifiers is a same amount in decibels (dB);
the attenuator between each adjacent pair of the second set of amplifiers is a same amount in decibels (dB).

8. The signal power detector as in claim 1, wherein
the detector has two inputs and includes:
a difference circuit coupled to the two inputs;
a summing circuit coupled to the two inputs; and
a multiplier circuit coupled to the difference circuit and the summing circuit.

9. A method of operating a signal power detector, including steps of
amplifying an input signal in response to a log-linear variable gain amplifier, the log-linear variable gain amplifier responsive to a control node;
wherein the steps of amplifying include steps of:
providing a set of current signals in response to a control node;
using a first set of amplifiers, each responsive to an independent one of the current signals, wherein each one amplifier in the first set has decreased gain from a previous amplifier;
using a second set of amplifiers each responsive to an independent one of the current signals, wherein each one amplifier in the second set has the same gain as a previous amplifier;
attenuating the input signal further for each one of the second set of amplifiers;
summing outputs from at least some of both the first and second sets of amplifiers;
providing an output of a detector of an output of the log-linear variable gain amplifier to the control node of the log-linear variable gain amplifier;
wherein an output of the detector is responsive to a steady-state level of an input signal to the log-linear variable gain amplifier.

10. The method as in claim 9, including
adjusting the variable gain amplifier in response to temperature, the steps of adjusting responsive to changes in gain responsive to temperature, the changes in gain responsive to temperature including: a change in offset to gain in response to temperature, a change in slope of gain in response to temperature.

11. The method as in claim 9, wherein
reducing leakage between amplifiers using a canceling stage cross-coupled with the each one amplifier in either the first set of amplifiers or the second set of amplifiers.

12. The method as in claim 9, wherein
reducing leakage between amplifiers using one or more isolating switches coupled to each one amplifier in either the first set of amplifiers or the second set of amplifiers, the isolating switches controlled by a switch control correlated with the current signals.

13. The method as in claim 9, wherein
the current signals include two zero current points and a peak current between the two zero current points.

14. The method as in claim 9, wherein
the decreased gain between each adjacent pair of the first set of amplifiers is a same amount in decibels (dB);
the attenuator between each adjacent pair of the second set of amplifiers is a same amount in decibels (dB).

15. The method as in claim 9, wherein
the detector has two inputs and includes:
a difference circuit coupled to the two inputs;
a summing circuit coupled to the two inputs; and
a multiplier circuit coupled to the difference circuit and the summing circuit.

\* \* \* \* \*